United States Patent [19]
Pipkin

[11] Patent Number: 4,789,426
[45] Date of Patent: Dec. 6, 1988

[54] PROCESS FOR PERFORMING VARIABLE SELECTIVITY POLYSILICON ETCH

[75] Inventor: Mark A. Pipkin, Melbourne, Fla.

[73] Assignee: Harris Corp., Melbourne, Fla.

[21] Appl. No.: 778

[22] Filed: Jan. 6, 1987

[51] Int. Cl.<sup>4</sup> .......................................... H01L 21/302
[52] U.S. Cl. ..................... 156/643; 156/646; 156/653; 156/657; 156/659.1; 156/662
[58] Field of Search ............... 156/643, 646, 644, 653, 156/657, 662, 659.1; 204/192.37; 252/79.1

[56] References Cited

U.S. PATENT DOCUMENTS 4,543,597  9/1985  Shibata ................................. 156/643
4,615,764 10/1986  Bobbio et al. ......................... 156/643

Primary Examiner—David L. Lacey
Assistant Examiner—Thi Dang
Attorney, Agent, or Firm—Antonelli, Terry & Wands

[57] ABSTRACT

A method for controllably varying the selectivity of reactive etching process for etching a polysilicon film, involves the addition of an adjustable amount of oxygen ($O_2$) to a chlorine based chemistry (e.g. $Cl_2$, HCl) during the etching process. The adjustable amount of oxygen permits the selectivity to be varied from a low to moderate rate at the beginning of the etch and through most of the film thickness to as high a selectivity as is required for overetch, to allow anisotropic removal of polysilicon without penetrating thin oxide. Selectivity is effectively proportional to the oxygen concentration and may be varied from a low to moderate selectivity value (e.g. 20:1) to a high selective value (e.g. 100:1) of polysilicon oxide etch rate in a controlled manner.

14 Claims, 4 Drawing Sheets

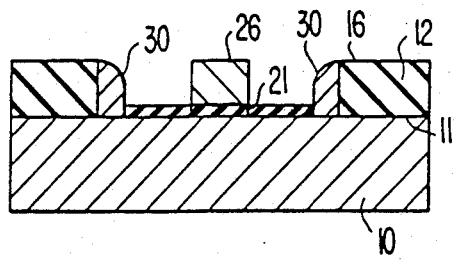
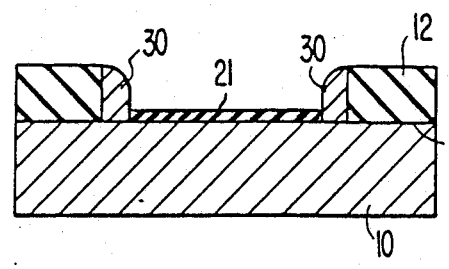
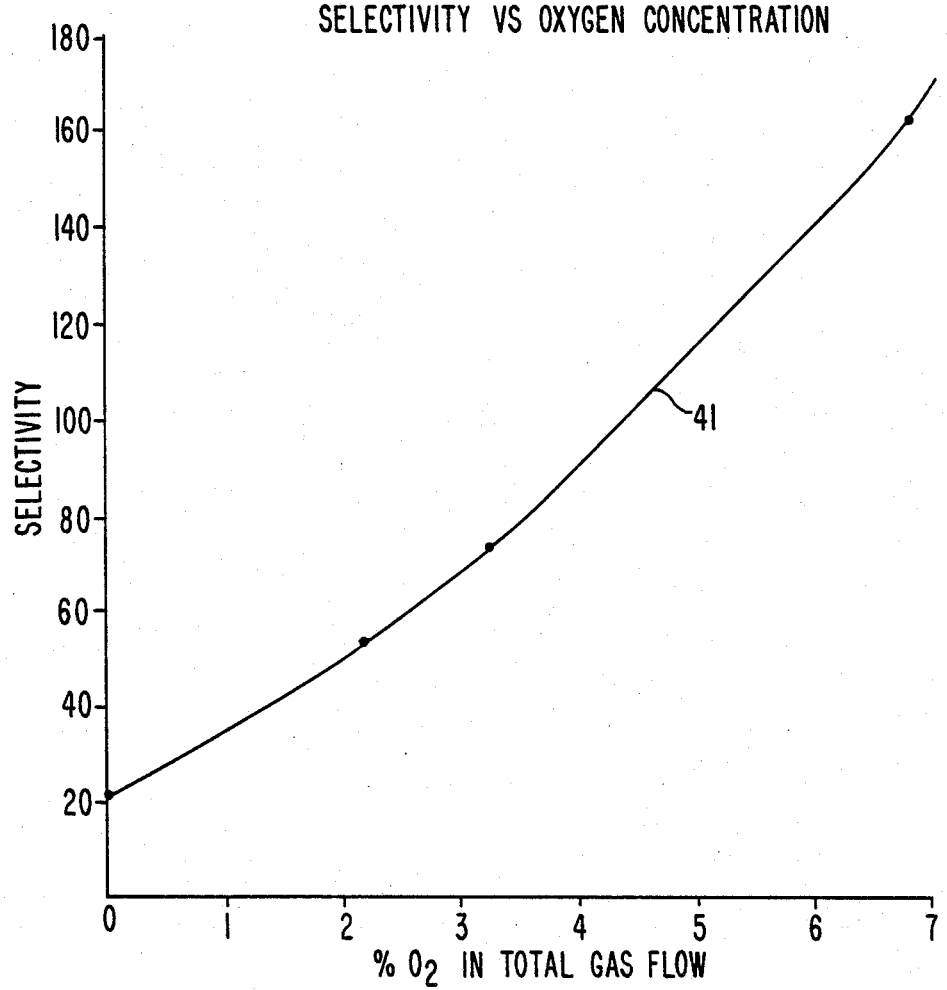

PROCESS FOR PERFORMING VARIABLE SELECTIVITY POLYSILICON ETCH

FIELD OF THE INVENTION

The present invention relates in general to the manufacture of semiconductor devices and, in particular, to a method for controlling the selectivity of chlorine chemistry-based reactive ion etching of polysilicon thin films.

BACKGROUND OF THE INVENTION

Over the past few years, the semiconductor industry has devoted considerable attention to the use of reactive ion etching (RIE) processes for effectively mapping photoresist patterns into polysilicon thin films. In accordance with such a process, radio frequency (RF) energy is employed to excite a low pressure (e.g. 5-100 milli-Torr) gas into a plasma state. This plasma is employed to create reactive species by dissociating less reactive molecules into their chemically active components (e.g. chlorine atoms from $Cl_2$ or HCl). Reactive ion etching is distinguished from conventional plasma etching by the fact that the substrate upon which the silicon wafer being etched is mounted forms an electrode for the RF power source used to create the plasma. As such, a DC self-bias is created between the plasma and the silicon wafer, typically on the order of $-150$ to $-350$ volts. This negative self-bias establishes an electric field which accelerates the positively charged ions of the plasma in a direction normal to the surface of the substrate, whereby the ions are caused to impact the wafer surface. The ion bombardment of the surface of the wafer enhances the etch rate in the vertical direction (normal to the wafer surface) relative to the horizontal direction and results effectively in an anisotropic etch of the wafer surface.

Conventional plasma etching equipment (through which the substrate electrode is not driven and therefore does not correspond to RIE systems) does not provide this self-bias and, consequently, does not enjoy the etching enhancement provided by the ion bombardment. In the course of etching a semiconductor wafer using such conventional plasma etching equipment, in the absence of some form of sidewall masking, the wafer cannot be etched anisotropically, but instead proceeds isotropically, resulting in an undercut of the photoresist pattern and preventing attainment of a precise small geometry topography.

Although the anisotropic etching capability of RIE equipment is generally desirable, it can create problems when used in conjunction with certain topographies. An example of such a topography involves direct moat wafer processing in which a field oxide, that is formed on the planar surface of a substrate and is used to prevent the creation of unwanted parasitic devices beneath overlying interconnect material, has formed therein apertures or windows through which dopants for forming device regions are introduced, and within which gate electrodes are to be provided.

An illustration of an exemplarily embodiment of an apertured field oxide layer for forming a field effect device in a semiconductor (e.g. silicon) substrate using such processing is shown in FIGS. 1-8, of which FIGS. 1, 3, and 5 are plan views of the device while FIGS. 2, 4 and 6 are sectional views along line A-A' of FIGS. 1, 3, 5, respectively. FIG. 7 is a sectional view taken along line B-B' of FIG. 5, while FIG. 8 is a sectional view taken along line C-C' of FIG. 5. As shown in FIGS. 1 and 2, a (silicon) substrate 10 having a planar surface 11 has a field oxide layer 12 formed thereon (typically to a thickness on the order of 5,000-8,000Å). Field oxide layer 12 has an aperture or window 13 formed therein exposing a surface region 14 of the planar surface 11 of substrate 10. The sidewalls 15 of window 13 are effectively perpendicular to planar surface 11, so as to allow subsequent formation of an insulative spacer thereat.

Next, as illustrated in FIGS. 3 and 4, following the formation of a thin dielectric (gate oxide) layer 21 (having a thickness on the order of 100-400Å), gate electrode material (e.g. doped polysilicon) 25 is nonselectively formed on the top surface 16 of the field oxide layer 12 and on the thin gate oxide layer 21 within the entirety of the aperture 13. Many methods of polysilicon deposition (e.g. low pressure chemical vapor deposition (LPCVD)) provide a conformal film (layer 25) that has the same film thickness over the vertical and horizontal features of the topography upon which it is formed. This conformal film results in a vertical film thickness T at the step of the field oxide 12, which is equal to the film thickness t in the areas overlying the field oxide plus the height of field oxide step itself.

Layer 25 of the polysilicon gate material is then selectively etched anisotropically to form a gate electrode layer 26 which, as shown in FIGS. 4 and 6, overlies the top surface 16 of field oxide layer 12 and extends onto the thin gate oxide layer 21. During this step, that portion of the polysilicon layer 25 whereat the gate electrode 26 is to be formed is masked and the exposed polysilicon material is reactive ion etched, so as to remove the polysilicon layer in a direction normal to the surface 11 of the substrate 10 down to the surface of the field oxide layer 12 and substrate surface 11, partially removing exposed surface portions of the thin gate oxide layer 21 adjacent to the masked polysilicon gate 26 and the field oxide layer 12. Complete removal of the gate oxide layer 21 would result in etching of the substrate 10 which is unacceptable from a standpoint of the final device configuration.

More particularly, the anisotropic etch of the polysilicon proceeds until a thickness t as shown in FIG. 4 is removed. At this point, the gate oxide layer 21 becomes exposed to the etch environment. Once exposed, the gate oxide 21 begins to etch. Should all of the gate oxide 21 be etched away, the etch will proceed into the silicon substrate 10 and effectively destroy the device. Stopping the etch before this complete removal of the gate oxide occurs will, for typical values of gate and field oxides, leave some of the polysilicon having a thickness equal to the oxide wall height around the oxide wall as shown at region 30 in FIGS. 7 and 8. This residual thickness is commonly referred to as a stringer and constitutes a severe problem, as it effectively connects adjacent devices together with the conducting polysilicon material.

If an attempt is made to remove the stringer by continuing the etch, a percentage overetch equal to the step height divided by the film thickness t in the horizontal areas is required (e.g. if the step height is 8,000Å and the film thickness t is 5,000Å, then a 160% over etch would be required to clear the polysilicon stringer 30).

Chlorine chemistries (e.g. $Cl_2$, HCl, or $BCl_3$) are often chosen for etching polysilicon because of their higher selectivity to oxide than that easily achieved using a florine chemistry. See, for example, an article entitled "Anisotropic and Selective Reactive Ion Etching of Polysilicon using $SF_6$" by P. Parrens, J. Vac. Sci. Technol. Vol. 19, No. 4, pg. 1403 (1981). Selectivity of etch is defined as the ratio of the etch rate of the film that is preferentially etched to the etch rate of the underlying film. For example, a polysilicon etch rate that is twenty times faster than the etch rate of the underlying oxide film would result in a selectivity of twenty, a value which is typical of a moderate selectivity chlorine chemistry reactive ion etch. If such a long overetch is attempted with an etch material that has only moderate selectivity to oxide, the thin gate oxide layer would be completely removed and the underlying silicon in the active device areas would be etched, resulting in destruction of the device. For example, in the configuration shown in FIGS. 1–8 above, if the thickness of the gate oxide layer 21 is on the order of 200Å, then, in order to leave a safe amount of gate oxide (100Å) after removal of stringer 30, a selectivity of 80 would be required.

While it is possible to remove the stringer isotropically using a (non-RIE) plasma etch, such a process would result in undercutting of one film thickness per side of photoresist, or a total loss of two film thicknesses per line. For example, with a 5,000Å polysilicon film thickness, the total linewidth loss would be 10,000Å or 1 micron using an isotropic etch. Such a loss is unacceptable in the fabrication of narrow line width topographies.

As described in an article entitled "Anisotropic Plasma Etching of Polysilicon" by C. J. Mogab and H. J. Levinstein, J. Vac. Sci. Technol., Vol 17, No. 3, pg. 721 (1980), an anisotropic plasma etch employing sidewall protection chemistry requires the same high selectivity as anisotropic reactive ion etch in order to remove the unwanted polysilicon stringer 30 without etching through the gate oxide layer 21.

High selectivity (50–100) etches using unusual gases (expensive, and not normally employed in standard polysilicon etching processes) have been reported in articles such as "Anisotropic Plasma Etching of Polysilicon with 100:1 Selectivity over Thermal Oxide" by D. B. Rao in SPIE Vol. 470, "Optical Microlithograph III: Technology for the Next Decade", pg. 39 (1984) and "Highly Selective Dry Etching of Polysilicon Using Chlorinated Gas Mixtures for VLSI Applications" by E. Degenkolb et al, J. Electrochem Soc.: Solid-State Science and Technology, Vol. 132, No. 8, pg. 2207 (1985). However, because of their high selectivity, such etches have difficulty in penetrating the thin native oxide which forms on the top surface of the polysilicon when exposed to air. This difficulty results in a prolonged initiation of the polysilicon etch and, because the native oxide is not of uniform thickness, different regions of the oxide are removed at different points in time on the surface the wafer. This nonuniformity results in the polysilicon areas which are first exposed beginning to etch 50–100 times faster than areas still covered by the native oxide, thereby transferring and enlarging the non-uniformities in the original native oxide into the polysilicon film.

A further complication of the process is due to the impact of the impurity doping concentration of the polysilicon film upon the etch rate. Polysilicon films having high N-type dopant (e.g. arsenic or phosphorus) concentrations (namely having sheet resistivities on the order of 10–30 ohms per square) etch at a much higher rate than lightly or undoped polysilicon. In fact, this etch rate enhancement of doped polysilicon can be more than twice that of an undoped film. A side effect of this faster etch rate is that it reduces the ratio of the vertical etch rate in the open areas (exposed to the reactive ion etch bombardment) to the horizontal etch rate in the areas covered by the photoresist. This ratio reduction results in a less anisotropic etch and greater undercut of the photoresist pattern.

SUMMARY OF THE INVENTION

In accordance with the present invention, the shortcomings of conventional reactive etching processes as applied to polysilicon films, described above, are overcome by an etching process having controllably variable selectivity, so as to enable the etching process to begin at a low to moderate selectivity to oxide (for enabling the penetration of the native oxide and the removal of most or all of the film thickness) and then proceed to higher selectivity etch (to allow the anisotropic removal of the polysilicon stringer without penetrating the thin gate oxide).

To this end, the present invention involves the controlled addition of an adjustable amount of oxygen ($O_2$) to a chlorine based chemistry (e.g. $Cl_2$, HCl) during the etching process. In the present description, the term "chlorine chemistry" refers to the chemical reactant and reactions involved in producing the volatile etch products which go into the gas phase and are pumped away by a vacuum system. In this case, chlorine is the reactant or etchant species that forms volatile silicon chlorides (at the pressures and temperatures involved in a reactive ion etch (RIE) system the species $SiCl_3-$ and $SiCl_4$ have a vapor pressure greater than the tens of millitorr operating pressure in the RIE system; hence they evaporate into the gas phase). The adjustable amount (mass per cent) of oxygen permits the selectivity to be varied from a low to moderate rate at the beginning of the etch and through most of the film thickness to as high selectivity as is required for overetch, to allow anisotropic removal of the polysilicon stringer without penetrating the thin gate oxide layer. Selectivity is effectively proportional to the oxygen concentration and may be varied from a low to moderate selectivity value (e.g. 20:1) to a high selective value (e.g. 100:1) of polysilicon oxide etch rate in a controlled manner.

Advantageously, because the basic chemistry of the reactive ion etching process is chlorine-based, exotic gas chemistries (and the accompanying cost and complexity of extra gas lines, controllers, cabinets, etc.) and multiple steps (which impact throughput and manufacturability) are avoided.

Where the present invention is applied to wafer materials including highly doped polysilicon, maintenance of the attended geometry (avoidance of side/under etch) during the high selectivity stringer-removal step is achieved by the addition of an inert, high atomic mass gas (e.g. argon, krypton, xenon) into the gas flow inlets of the RIE system.

BRIEF DESCRIPTION OF THE DRAWINGS

FIGS. 6, 7 and 8 are sectional views of the semiconductor structure of FIG. 5 taken along lines A-A', B-B' and C-C', respectively;

FIG. 10 shows the relationship between etch selectivity (polysilicon:oxide etch rate) and oxygen concentration of a chlorine-based reactive ion etch chemistry in accordance with the present invention;

DETAILED DESCRIPTION

Figure 1:
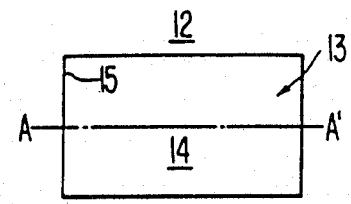
FIG. 1 a plan view of a semiconductor structure having a conventional vertical sidewall-apertured field oxide layer.
Figure 2:
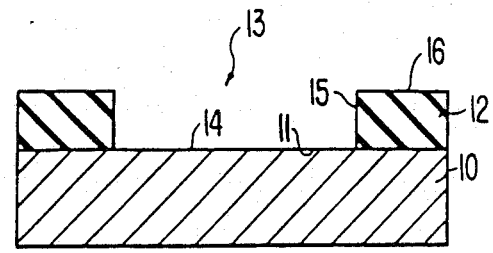
FIG. 2 is a sectional view the semiconductor structure of FIG. 1 taken along line A–A' thereof.
Figure 3:
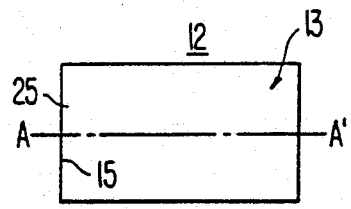
FIG. 3 is a plan view of the semiconductor structure of FIG. 1 having a layer of polysilicon conformly deposited thereon.
Figure 4:
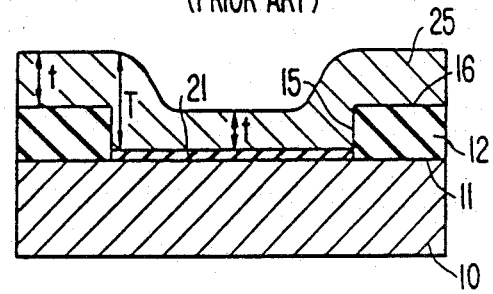
FIG. 4 is a sectional view of the semiconductor structure of FIG. 3 taken along line A-A' thereof.
Figure 5:
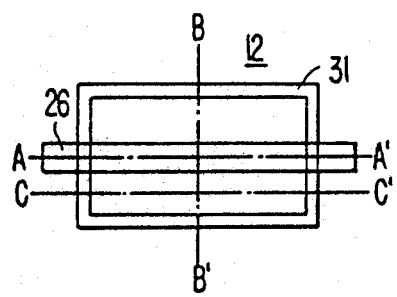
FIG. 5 is a plan view of the semiconductor structure of FIG. 3 that has been selectively etched to form a polysilicon gate electrode.
Figure 6:
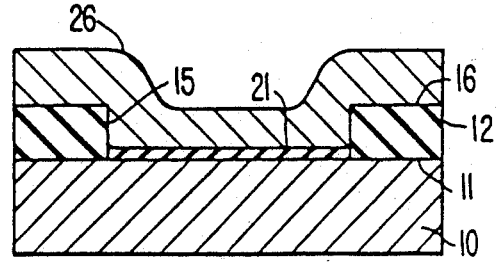

As explained briefly above, Applicant has discovered that the addition of an adjustable amount of oxygen ($O_2$) to a chlorine-based (e.g. $Cl_2$, $BCl_3$ or HCl) reactive ion etch system for etching polysilicon permits a variable adjustment of the etch selectivity (polysilicon:oxide etch rate) in a controlled manner. The selectivity has been observed to be effectively proportional to the concentration of oxygen in the gas phase, with the selectivity characteristic varying in a gradual fashion from a value on the order of 20:1. This controllable variable selectivity permits the selectivity to be adjusted from a low to moderate value at the beginning of the etching process (to allow for easy initiation through the thin native oxide and the removal of most or all of the deposited polysilicon in the areas overlying the field oxide) to as high a selectivity as required during the overetch (to allow removal of the unwanted polysilicon stringers from regions adjacent vertical sidewalls of the field oxide, without etching through the thin gate oxide).

EXAMPLE I

The wafer structure to which the present invention was applied effectively corresponds to that illustrated in FIGS. 1-8 of the Drawings described above. Accordingly, reference will be had to FIGS. 1-8 in the description of the preparation of the wafer including the formation of the polysilicon film that is to be subjected to the controlled selectivity etch of the present invention.

On the surface of each of a plurality of wafers (corresponding to an N-type 3-5 ohm cm (100) silicon substrate 10), a thermal oxide layer 12 having a thickness on the order of 8,000Å was formed. This oxide layer was patterned using an overlying photoresist and the pattern transferred to the oxide 12 to form an aperture 13 exposing region 14 of the top surface 11 of the underlying silicon by anisotropic etching. A thin gate oxide layer (corresponding to layer 21) having a thickness on the order of 300Å was grown on the exposed surface 14 of substrate 10 and a thick (thickness on the order of 6,000Å) polysilicon film was deposited conformably over the surface of each wafer by a low pressure chemical vapor deposition. Polysilicon film 25 was then doped with phosphorus to achieve a final sheet resistivity on the order of 20 ohms per square.

Positive photoresist (e.g. Hunt 204 photoresist) was then spun onto each wafer and patterned to define regions where the polysilicon film was to be selectively etched. A series of etches were performed upon individual batches of such wafers using a conventional hexode-type RIE polysilicon etch system equipped with separate gas channels for argon, HCl, $Cl_2$ and oxygen.

As illustrated in FIGS. 7 and 8, the polysilicon layer 25 of each wafer was selectively etched completely through the polysilicon to expose the thin oxide layers 21, leaving a polysilicon stringer 30 adjacent the vertical sidewalls of the oxide layer 12. After reaching this point in the process, a controlled mass percent flow of oxygen was introduced into the gas stream of the RIE system by opening the oxygen channel to a set mass percent flow for carrying out the overetch. A series of such etches were conducted using different oxygen flow rates. Each overetch was conducted at a pressure of 15 millitorr, a total flow of 93 sccm (i.e. $HCl+O_2=93$ sccm), a power of 520 watts and an overetch time of five minutes. Wafers were then studied using a scanning electron microscope to verify that the polysilicon stringer 30 had been removed from adjacent the sidewall 15 of the oxide layer 12. Also, using an ellipsometer the amount of the thin oxide layer 21 remaining within aperture 14 was measured.

Figure 9:
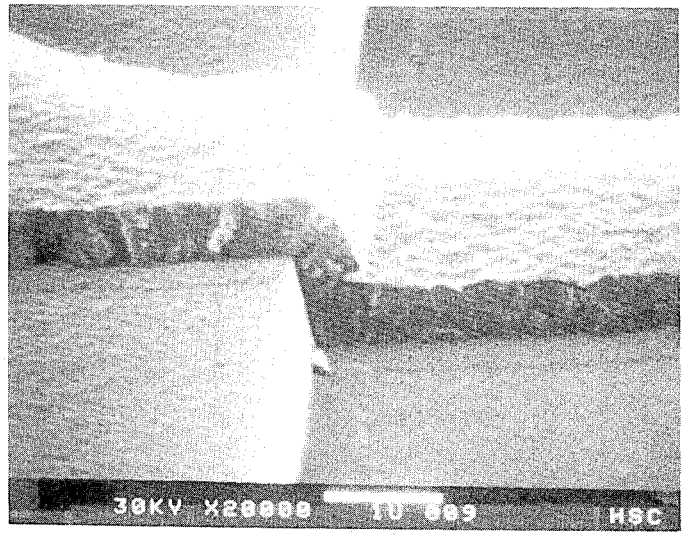
FIG. 9 is a scanning electron microphotograph of the semiconductor structure shown in FIGS. 5 and 6 that has been subjected to controlled selectivity anisotropic etching to remove unwanted polysilicon stringers.

A representative scanning electron microphotograph of a wafer is shown in FIG. 9. The selectivity for each etch was calculated by subtracting from 300Å (the original thickness of oxide layer 21) the amount of oxide remaining as measured by the ellipsometer and dividing this amount into 8,000 (the height T of the original polysilicon film, and hence the original height of the stringer 30). This calculation may be represented by the following expression:

Selectivity (S)=8,000Å/(300Å−oxide thickness (Å) remaining after etch).

The results of these measurements for the respective wafers are tabulated in Table I below and plotted as points from which a curve 41 in the graph of FIG. 10 may be derived.

TABLE I

| MASS PERCENT $O_2$ | SELECTIVITY POLY:OXIDE |
|---|---|
| 0 | 22:1 |
| 2.2 | 53:1 |
| 3.3 | 74:1 |
| 7.0 | 164:1 |

As can be seen from Table I and curve 41 of FIG. 10, the selectivity (etch rate of polysilicons oxide) varies in a gradual and controllable manner with respect to oxygen flow rate over a range of from about 20 to 160.

It will be appreciated, therefore, that by controlling the amount of introduction of oxygen flow into the chlorine-based reactive ion etch system, the polysilicon:oxide etch rate selectivity may be adjusted from a low to moderate value at the beginning of the etch (thereby allowing easy initiation through the thin native oxide and the removal of most or all of the as deposited polysilicon film thickness in the regions overlying the field oxide layers) to as high a selectivity as necessary during overetch (to allow for clearance of the polysilicon stringers 30 from regions adjacent the sidewalls 15 of the vertical regions (oxide layer 12) on the wafer 10 without etching through the thin gate oxide layer 21).

While the mechanism of the interaction of the controllably introduced oxygen into the chlorine-based reactive ion etch system is not completely understood, it is believed that the added oxygen competes with the chlorine in its attempt to etch the thin oxide layer underlying the polysilicon stringer. As a result, as the polysilicon stringer is being rapidly anisotropically etched, either no oxide or only a limited amount of oxide of layer 21 is effectively removed.

EXAMPLE 2

As pointed out briefly above, where the polysilicon layer 25 comprises highly doped N-type polysilicon (e.g. having a sheet resistivity less than 30 ohms per square) the controlled selectivity anisotrophic etching process described in Example I may be enhanced by the addition of an inert gas the atomic mass of which is higher than that of silicon to be etched in order to maintain control of the line width of the selectively etched polysilicon. Examples of such inert or noble high atomic mass gases are argon (atomic mass=39.944 amu (atomic mass units)), krypton (atomic mass=83.80 amu) and xenon (atomic mass=131.30 amu). Silicon has an atomic mass of 28.90 amu; accordingly each of argon, krypton and xenon has a high atomic mass (relative to silicon), while other inert or noble gases such as helium (atomic mass=4.003 amu) and neon (atomic mass=20.18 amu) may be considered to be low and moderate atomic mass gases, respectively, (relative to the atomic mass of silicon). In terms of the present practical use argon is a preferred high atomic mass inert gas because of its cost and level of purity in production is acceptable.

In order to test the effectiveness of the addition of the high atomic mass inert gas, separate wafer lots were subjected to separate controlled etching processes, one being augmented by the introduction of a low atomic mass, inert gas (helium) and the augmented by a high atomic mass, inert gas (argon). For each lot, the same process described above in conjunction with Example I was carried out except for the addition of the respective inert gases.

After the photoresist was patterned, the linewidth of a critical dimension device was measured at three positions on respective wafers for each etch batch. Two batches of wafers were etched in the same reactive ion etch system as in Example I down to the surface of the thin gate oxide layer, leaving a polysilicon stringer adjacent the vertical sidewall 15 of the field oxide layer 12. In the first batch, helium (an inert, but low mass gas) was introduced into the oxygen/HCl overetch system. The control settings were 2 sccm $O_2$, 35 sccm HCl, and 45 sccm He at a pressure of 10 millitorr and a power of 400 watts for 10 minutes overetch time. The second batch was identical to the first except that argon (an inert, high atomic mass gas) was substituted for helium (45 sccm). Other high atomic mass inert gasses, such as xenon and krypton are also suitable. After etching the polysilicon stringers, the photoresist was removed and the linewidths were remeasured at the same positions.

The results in terms of change in linewidth are tabulated in Table II below.

TABLE II

| ETCH TYPE | PRE-ETCH LINEWIDTH | POST-ETCH LINEWIDTH | CHANGE IN LINEWIDTH |
|---|---|---|---|
| Helium | 2.60 μm | 1.37 μm | 1.23 μm |
| Argon | 2.61 μm | 2.51 μm | 0.11 μm |

In addition to these measurements, separate wafers from each batch were photographed using a scanning electron microscope using effectively the same magnification for purposes of examining linewidth maintenance.

Figure 11:
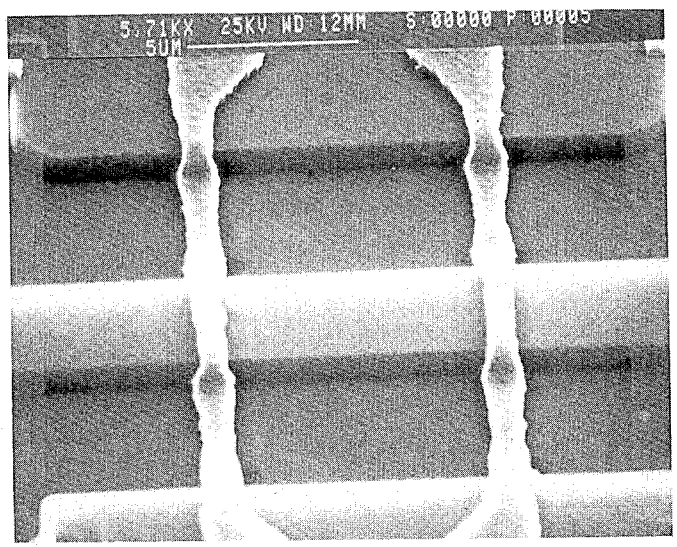
FIG. 11 is a scanning electron microphotograph of a wafer structure corresponding to that illustrated in FIGS. 5 and 6 in which the polysilicon layer 26 is heavily doped and subjected to a reactive ion chlorine-chemistry based etch augmented by the addition of an inert, low mass gas (helium)
Figure 12:
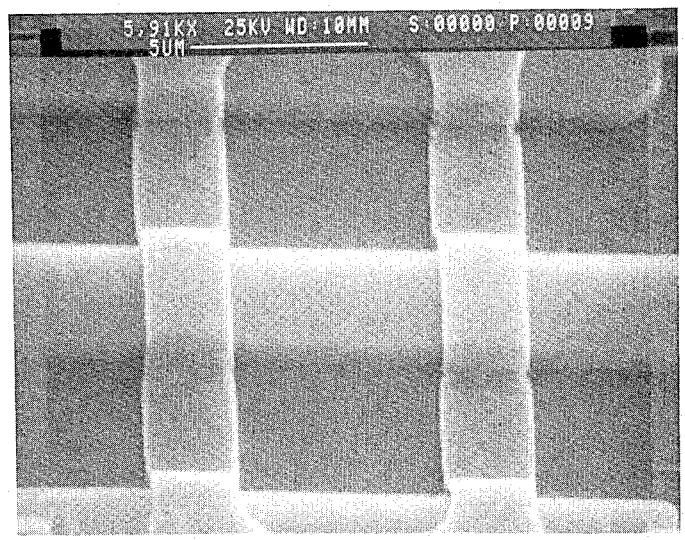
FIG. 12 is a scanning electron microphotograph of a wafer structure corresponding to that illustrated in FIGS. 5 and 6 in which the polysilicon layer 26 is heavily doped and subjected to a reactive ion chlorine-chemistry etch augmented by the addition of an inert, an inert high mass gas (argon).

Microphotographs of the results of the anisotropic overetch using a low atomic mass inert gas (helium) and a high atomic mass inert gas (argon) are shown in FIGS. 11 and 12. As can be seen from the data tabulated in Table II and the configurations of the polysilicon in from the photographs of FIGS. 11 and 12, the introduction of a high atomic mass inert gas (argon) into the oxygen chlorine based RIE system during selective overetch significantly reduces the amount of photoresist undercut when the polysilicon layer is comprised of N-type heavily doped polysilicon. In effect, because the inert gas is high atomic mass, the plasma ions thereof which are accelerated toward the surface of the substrate and thereby impact the polysilicon during the overetch impart a greater quantity of energy for etching the polysilicon than do the lighter helium ions. This effectively speeds up the etch rate during the overetch process, thereby providing less time for the polysilicon film underneath the photoresist to be subjected to undercut.

As will be appreciated from the foregoing description, the present invention provides a reactive ion etch methodology for controlling the selectivity of a chlorine-based etch for removing polysilicon from a wafer structure without effectively deteriorating exposed oxide material adjacent the polysilicon. Because the selectivity is effectively continuously proportional to the oxygen concentration in the chlorine-based reactive ion etch system, the etch rate may be adjustably tailored throughout the etching processing to achieve removal of only selected regions of the wafer topography at an etching rate which insures the remaining wafer structure is maintained. Moreover, although a chlorine-based reactive ion etch system has been detailed as a preferred embodiment, the invention may be successfully practiced in other halogen-based chemistries, such as a bromine-based system.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A method of controllably enhancing the etch rate of a layer of polysilicon relative to the etch rate of an oxide layer each of which layers is to be simultaneously exposed to a prescribed chlorine chemistry-based etch system, comprising the step of controllably modifying the composition of said chlorine chemistry-based etch system by controllably introducing thereinto an adjustable amount of oxygen.

2. A method according to claim 1, wherein the amount of oxygen in said system is adjusted over a range of oxygen concentration of an amount up to 7 percent sufficient to provide a selectivity of etch of polysilicon:oxide over a range of from 20 to 160.

3. a method according to claim 1, wherein said etch system comprises a reactive ion etch system.

4. A method according to claim 3, wherein said chlorine-based reactive ion etch system comprises a gas selected from the group consisting of $Cl_2$, HCl, $BCl_3$ and mixtures thereof.

5. A method according to claim 3, further including the step of introducing a relatively high atomic mass inert gas into said system so as to further enhance the etch of said polysilicon layer.

6. A method according to claim 5, wherein said high atomic mass inert gas includes one selected from the group consisting of argon, krypton and xenon.

7. A method of manufacturing a semiconductor device comprising the steps of:
 (a) selectively forming an insulator layer on a surface of semiconductor substrate so as to expose said surface through an aperture in said insulator layer;
 (b) forming a thin oxide layer on said exposed surface of said substrate:
 (c) forming a layer of polysilicon on said insulator layer and on said thin oxide layer;
 (d) exposing a selected portion of the polysilicon layer and thin oxide layer resulting from step (c) to an anisotropic chlorine chemistry-based etch system; and
 (e) during step (d) controllably introducing oxygen into said anisotropic etch system so as to increase the ratio of the etch rate of said system for polysilicon to the etch rate of said system for oxide and thereby remove said selected portion of the polysilicon layer without effectively removing said thin oxide layer.

8. A method according to claim 7, wherein said anisotropic chlorine chemistry-based etch system comprises a reactive ion etch system.

9. A method according to claim 7, wherein said anisotropic chlorine chemistry-based reactive ion etch system comprises a gas selected from the group consisting of $Cl_2$, HCl, $BCl_3$ and mixtures thereof.

10. A method according to claim 7, further including the step of
 (f) during step (d), introducing a relatively high atomic mass inert gas into said system so as to enhance the removal of said selected portion of said polysilicon layer.

11. A method according to claim 7, wherein step (d) comprises masking a portion of said polysilicon layer other than said selected portion thereof and exposing said selected portion and said thin oxide layer to said chlorine chemistry-based anisotropic etch system.

12. A method according to claim 11, wherein said anisotropic etch system comprises a reactive ion etch system.

13. A method according to claim 12, further including the step of
 (f) during step (d), introducing a relatively high atomic mass inert gas into said system so as to enhance the removal of said selected portion of said polysilicon layer without substantially side etching the masked portion of said polysilicon layer.

14. A method according to claim 13, wherein said polysilicon layer is a highly doped N-type polysilicon layer having a sheet resistance less than 30 ohms per square.

* * * * *